United States Patent [19]

Matsumoto et al.

[11] Patent Number: 4,470,132
[45] Date of Patent: Sep. 4, 1984

[54] MAGNETIC BUBBLE MEMORY DEVICE

[75] Inventors: Shinzo Matsumoto; Minoru Hiroshima, both of Mobara, Japan

[73] Assignee: Hitachi, Ltd., Tokyo, Japan

[21] Appl. No.: 439,807

[22] Filed: Nov. 8, 1982

[30] Foreign Application Priority Data

Nov. 11, 1981 [JP] Japan ................... 56-179698

[51] Int. Cl.³ ............................. G11C 19/08
[52] U.S. Cl. ................................... 365/43
[58] Field of Search ............ 365/15, 39, 42, 43, 365/44

[56] References Cited

OTHER PUBLICATIONS

Microelectronics—vol. 8, No. 2, 1977, pp. 9–12.

Primary Examiner—James W. Moffitt
Attorney, Agent, or Firm—Charles E. Pfund

[57] ABSTRACT

In a magnetic bubble memory device comprising a number of magnetic bubble propagation bit segments arrayed to form a magnetic bubble propagation path and having each a pattern of a length L in a direction of propagation of magnetic bubbles being less than 3.4 D where D is the average diameter of the magnetic bubbles and is not greater than $2.0\mu$, the height H of the pattern of the magnetic bubble propagation bit segments in a direction perpendicular to the propagation direction of magnetic bubbles is set to be in a range of $0.75 \times L \leq H \leq 1.1 \times L$.

2 Claims, 16 Drawing Figures

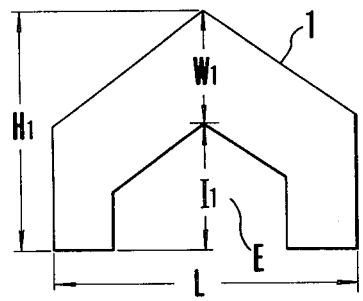
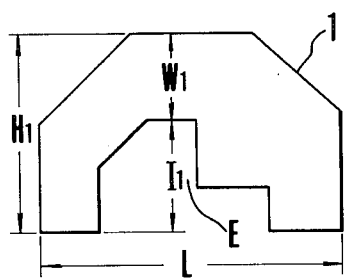
FIG.4a  FIG.5a
PRIOR ART  PRIOR ART
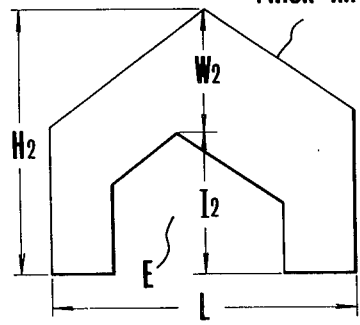
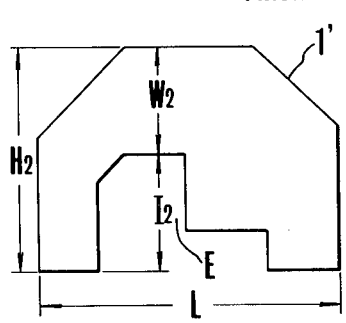
FIG.4b  FIG.5b
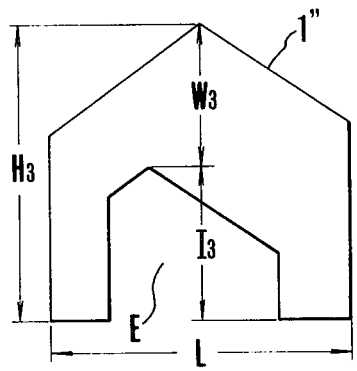
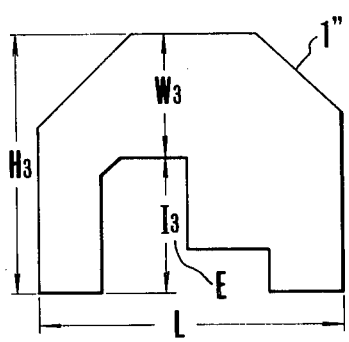
FIG.4c  FIG.5c

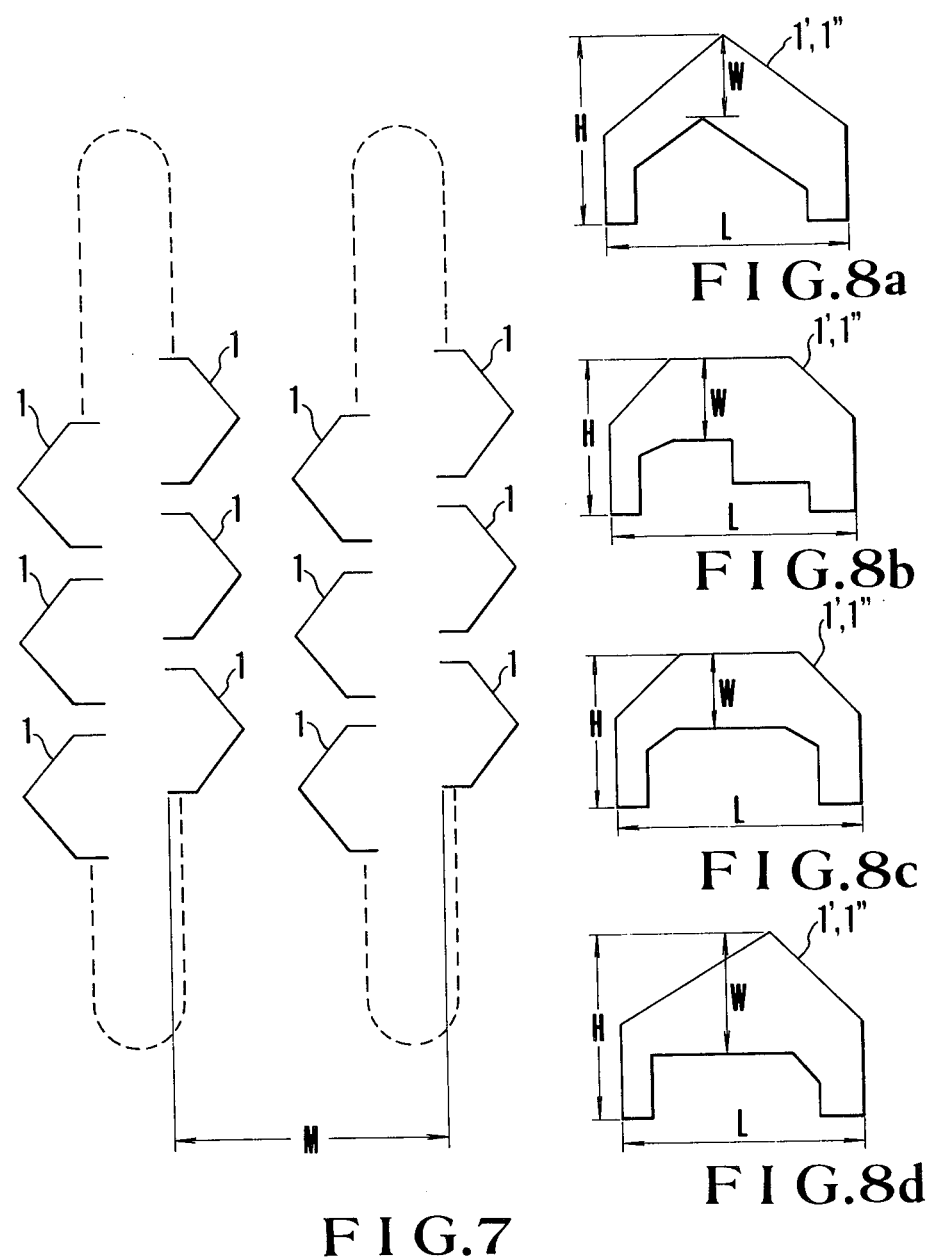

4,470,132

MAGNETIC BUBBLE MEMORY DEVICE

BACKGROUND OF THE INVENTION

This invention relates to magnetic bubble memory devices and, more particularly, to an improvement in the magnetic bubble propagation bit segment suitable for a high density magnetic bubble memory device.

In the past, in order to make magnetic bubble propagation bit segments adaptive for high density magnetic bubble memory devices of several Mb (mega bits), these segments were simply reduced in size in proportion to increase in density of the device. As a result, the surface area of the bit segments became too small to produce sufficient magnetic bubble driving force and proper and stable propagation of magnetic bubbles through the magnetic bubble propagation bit segments was prevented.

SUMMARY OF THE INVENTION

The invention has, in the light of the above drawbacks inherent in the prior art, as its principal object to provide a magentic bubble memory device which permits stable propagation of magnetic bubbles with increasing density of the device by specifying the dimension of the magnetic bubble propagation bit segments.

According to the invention, in a magnetic bubble memory device comprising a number of magnetic bubble propagation bit segments arranged to form a magnetic bubble propagation path and having each a pattern of a length L in a direction of propogation of magnetic bubbles being not greater than 3.4 D where D is the average diameter of the magnetic bubbles and is not greater than 2.0μ, the height H of the pattern of the magnetic bubble propagation bit segments in a direction perpendicular to the propagation direction of magnetic bubbles is set to be in a range of $0.75 \times L \lesssim H \lesssim 1.1 \times L$.

BRIEF DESCRIPTION OF THE DRAWINGS

FIGS. 4a to 4c and 5a to 5c are plan views respectively showing the way of changing the pattern shape of magnetic bubble propagation bit segments of the asymmetric chevron type and half disc type according to the invention;

FIG. 7 is a view showing an example of arrangement of magnetic bubble propagation paths using magnetic bubble propagation bit segments; and FIGS. 8a to 8d are plan views showing various examples of the magnetic bubble propagation bit segment.

DESCRIPTION OF PREFERRED EMBODIMENTS

Figure 1:
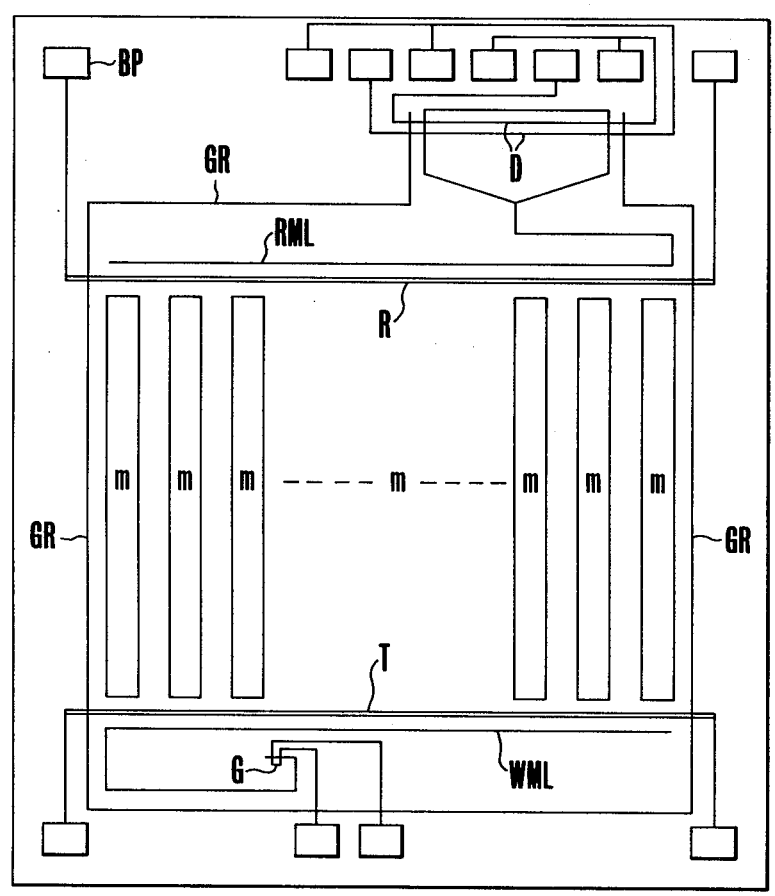
FIG. 1 is a schematic plan view showing an example of one arrangement of various basic elements in a magnetic bubble memory device.

On a chip of a magnetic bubble memory device are arranged various basic elements. FIG. 1 shows an example of such arrangement of basic elements. In FIG. 1, letter m denotes a minor loop which stores information, RML read major line to propagate the read-out information, and WML write major line to propagate the write-in information. Letter D denotes a bubble detector to convert magnetic bubbles to electric signals, G a bubble generator to generate magnetic bubbles, R a replicate gate circuit to replicate the information stored in the minor loop m to the read major line RML, and T is a swap gate circuit to exchange the information on the write major line WML and the information in the minor loop m. Letter GR denotes a guard rail encircling the outer periphery of all these part to guard against the entry of the magnetic bubbles from the outside, and BP a bonding pad to supply the operating pulse current from an external source.

Among these basic elements, the minor loop has a magnetic bubble propagation path comprised of a number of magnetic bubble propagation bit segments, and the invention is applicable to such a magnetic bubble propagation path as the minor loop.

Figure 2A:
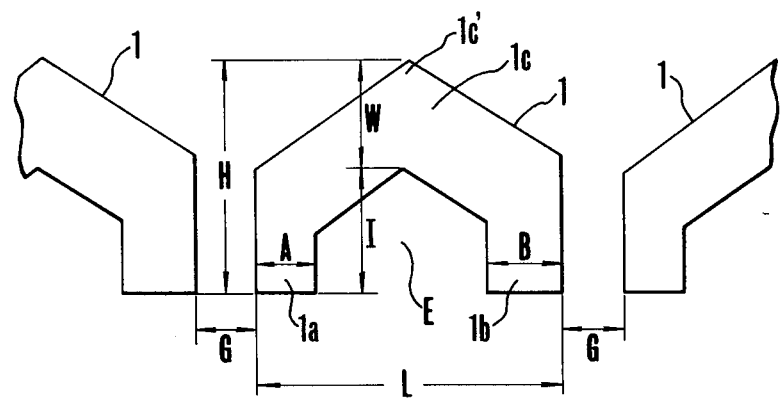
FIGS. 2a and 2b are plan views showing examples of the magnetic bubble propagation bit segment of the asymmetric chevron type and half disc type, respectively, to which the invention is applied.
Figure 2B:
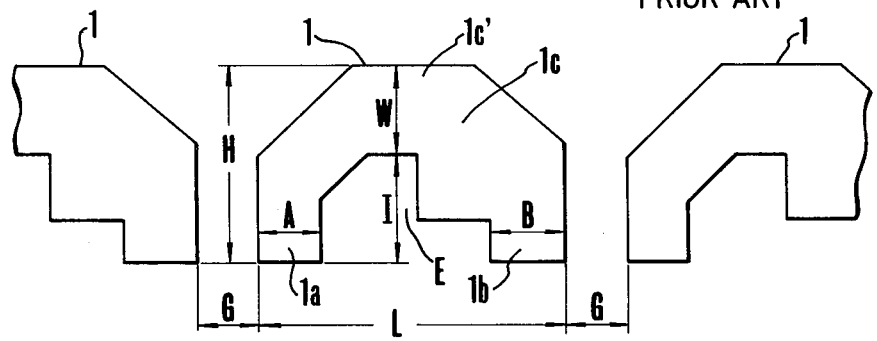
Figure 3:
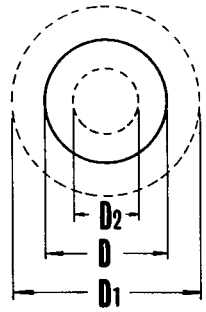
FIG. 3 is a view illustrating average bubble diameter.

Typical examples of magnetic bubble propagation bit segments of an asymmetric chevron type and a half disc type are shown respectively in FIGS. 2a and 2b. In these Figures, designated at 1 is the magnetic bubble propagation bit segment made of a magnetic metal thin film of Permalloy or the like material. The pattern of the magnetic bubble propagation bit segment 1 in either type has leg portions 1a and 1b and a main portion 1c. These portions are formed in a unit area having a dimension L in the direction of propagation of magnetic bubbles and a dimension H in the direction perpendicular to the direction of propagation. The width A of the leg portion 1a is $A \leq D$ where D is the average diameter of the magnetic bubbles. The width B of the other leg portion 1b is $B \geq D/2$. The dimension I of a space E, which is defined by the leg portions 1a and 1b and main portion 1c, in the perpendicular direction to the direction of propagation of the magnetic bubbles is $I \geq D/2$. The average diameter D of the magnetic bubbles is given as (D1+D2)/2 where D1 and D2 are respectively the bubble diameter immediately before the magnetic bubble runs out and the bubble diameter immediately before the magnetic bubble vanishes, as shown in FIG. 3.

With the magnetic bubble propagation bit segment 1 of the above construction, the magnetic bubbles are rotated through the leg portion 1b, main portion 1c and leg portion 1a in the mentioned order and propagated through successive bit segments 1 arrayed with a predetermined gap G.

With the above construction of magnetic bubble propagation bit segment, however, where the density of magnetic bubble memory device is increased to several Mb (mega bits), the shape, and hence the surface area, of the magnetic bubble propagation bit segment 1 is made small in proportion to the increasing density. Therefore, the magnetic bubble attraction force produced with a rated rotating magnetic field is practically insufficient to obtain smooth propagation of magnetic bubbles over the magnetic bubble propagation bit segments 1, thus giving rise to erroneous propagation operation and deteriorating the magnetic bubble propagation characteristics.

The inventors have conducted various experiments and researches to find that the erroneous propagation operation is mainly due to two phenomena, one being such that when a magnetic bubble fails to be properly propagated through the gap G between adjacent magnetic bubble propagation bit segments, it vanishes in the gap and the other being such that a magnetic bubble vanishes in an apex portion $1c'$ of the main portion of the magnetic bubble propagation bit segment 1. The invention is predicated on this finding and according to the invention, the dimension H of the magnetic bubble propagation bit segment 1 in a direction perpendicular to the direction of propagation of magnetic bubble and the dimension W of the main portion $1c$ in the perpendicular direction are increased to sufficiently increase the magnetic bubble attraction force produced in the gap G between adjacent magnetic bubble propagation bit segments 1 and in the apex portion $1c'$ of the main portion of the magnetic bubble propagation bit segment 1, thereby ensuring normal propagation of magnetic bubbles.

Now, embodiments of the invention will be described in detail with reference to the drawings.

FIGS. 4a to 4c show examples of asymmetric chevron pattern of the magnetic bubble propagation bit segment and FIGS. 5a to 5c show examples of half disc pattern. In these Figures, L is the dimension of the segment in the direction of propagation of magnetic bubbles, H is the dimension of the element in the direction perpendicular to the direction of propagation of magnetic bubbles, and W is the dimension of a main portion of the segment in the perpendicular direction. In the segments illustrated in FIGS. 4a to 4c and 5a to 5c, the dimensions H and W are progressively increased in the order of FIGS. 4a, 4b and 4c as well as FIGS. 5a, 5b and 5c with the dimension L fixed. In other words, the magnetic bubble propagation bit segments 1' and 1" are formed by setting H and W to be H1<H2<H3 and W1<W2<W3 where the dimensions H and W are specified to H1 and W1 in the prior art magnetic bubble propagation bit segment 1 shown in FIGS. 4a and 5a while the dimension L is set to be constant. Thus, FIGS. 4b and 4c as well as FIGS. 5b and 5c show bit segments embodying the invention. It should be noted in FIGS. 4a to 4c and FIGS. 5a to 5c that as the dimension H is increased the leg portions 1a and 1b (as identified in FIGS. 2a and 2b) in FIGS. 2a and 2b are lengthened automatically to attain sufficient magnetic bubble attraction force, which prevents the erroneous propagation operation around the gap G.

Figure 6:
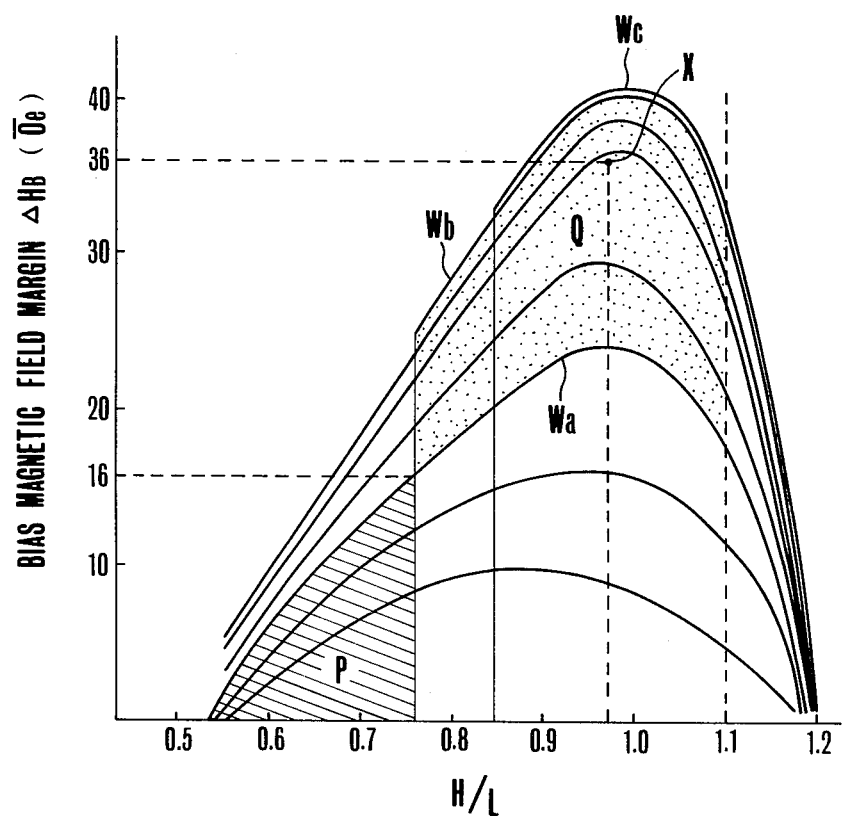
FIG. 6 is a graph showing an example of results of measurement of the magnetic bubble propagation margin for different values of the dimensions H and W of the magnetic bubble propagation bit segment in a direction perpendicular to the propagation direction of magnetic bubbles.

FIG. 6 shows data of magnetic bubble propagation characteristics which are experimentally obtained by varying the values of H and W. In FIG. 6, the ordinate is taken for the bias field margin $\Delta H_B$, and the abscissa is taken for H/L. The dimension W is used as a parameter. It will be seen from the Figure that as H and W increase, the pattern surface area of the propagation bit segments 1' and 1" are increased to increase the magnetic bubble driving force, thus increasing the bias magnetic field margin $\Delta H_B$. A hatched region P of $H \lesssim 0.75$ L and $Wa \lesssim 0.35$ L results with the prior art magnetic bubble propagation bit segments. In this case, the magnetic driving force is low, and the magnetic bubble propagation margin $\Delta H_B$ is less than about 16 Oe. If H is increased beyond $1.1 \times L$, $H > 1.1 \times L$, the bias field margin $\Delta H_B$ is quickly reduced. This is attributable to the interaction between adjacent magnetic bubbles and magnetic interaction between adjacent magnetic bubble propagation bit segments 1 due to too small a distance between adjacent magnetic bubble propagation loops. The pitch M between adjacent magnetic bubble propagation bit segments 1, as shown in FIG. 7, is selected to be within a range of 4D to 8D. In the case of FIG. 6, the data have been obtained by setting M=5D. With Wb=0.55×L, the bias magnetic field margin $\Delta H_B$ is zero for $H \lesssim 0.75 \times L$. With Wc=0.65×L, the bias field $\Delta H_B$ is zero for $H \lesssim 0.85 \times L$. This occurs because the dimensions I2 and I3 of the gap E formed in the magnetic bubble propagation bit segments 1' and 1" in the direction perpendicular to the propagation of magnetic bubbles are so small that magnetic bubbles erroneously enter the gap E during their propagation. According to the invention, the shape of the magnetic bubble propagation bit segment is set such that bias magnetic field margin $\Delta H_B$ is in a dotted region Q shown in FIG. 6, wherein H and W are set to be $0.75 \times L \lesssim H \lesssim 1.1 \times L$ and $0.35 \times L \lesssim W \lesssim 0.65 \times L$ respectively, whereby a magnetic bubble propagation bit segment having a satisfactory bias field margin $\Delta H_B$ can be obtained.

As a specific example, in case when the propagation margin $\Delta H_B$ necessary for the magnetic bubble memory device is about 36 Oe while the gap G between adjacent magnetic bubble propagation bit segments 1" is 1μ and average bubble diameter D is 2μ, a magnetic bubble propagation path adopting an asymmetric chevron pattern with L=5μ, A=1μ, B=1.2μ, W=2.3μ and H=4.8μ is found to be satisfactory. In this case, the shape of the pattern corresponds to the bit segments 1" shown in FIG. 4c and also corresponds to point X in the region Q in FIG. 6.

While the above embodiment has been concerned with magnetic bubble propagation bit segments of the asymmetric chevron pattern and half disc pattern as shown in FIGS. 8a and 8b, respectively, these patterns are by no means limitative, and entirely the same effects as described above may be obtained by using a symmetric half disc pattern as shown in FIG. 8c or a modified asymmetric chevron pattern as shown in FIG. 8d.

As has been described in the foregoing, with the magnetic bubble propagation bit segment according to the invention, a practically sufficient magnetic bubble driving force for driving the magnetic bubble memory device of an increased density can be obtained. Thus, it is possible to obtain a high density magnetic bubble memory device having a proper propagation.

What is claimed is:

1. In a magnetic bubble memory device comprising a number of magnetic bubble propagation bit segments arrayed to form a magnetic bubble propagation path and having each a pattern of a length L in a direction of propagation of magnetic bubbles being less than 3.4 D where D is the average diameter of the magnetic bubbles and is not greater than 2.0μ, the improvement wherein the height H of the pattern of the magnetic bubble propagation bit segments in a direction perpendicular to the propagation direction of magnetic bubbles is set to be in a range of $0.75 \times L \lesssim H \lesssim 1.1 \times L$.

2. A magnetic bubble memory device according to claim 1, wherein the pattern dimension W of a substantially central portion of said magnetic bubble propagation bit segment in the direction perpendicular to the direction of propagation of magnetic bubbles is set to be in a range of $0.35 \times L \lesssim W \lesssim 0.65 \times L$.

* * * * *